United States Patent [19]
Flemming

[11] 3,955,118
[45] May 4, 1976

[54] COLD-CATHODE ION SOURCE

[75] Inventor: John Peter Wilfred Flemming, Hopewell Township, Mercer County, N.J.

[73] Assignee: Western Electric Company, Inc., New York, N.Y.

[22] Filed: Feb. 19, 1975

[21] Appl. No.: 551,217

[52] U.S. Cl. .............................. 315/111.8; 313/36; 313/217; 313/240; 313/360; 315/116
[51] Int. Cl.² ..................... H01J 1/30; H01J 3/04; H01J 3/40; H01J 7/24
[58] Field of Search ........... 313/359, 360, 361, 362, 313/363, 36, 240, 217, 209; 315/111.8, 116, 117

[56] References Cited
UNITED STATES PATENTS

| | | | |
|---|---|---|---|
| 2,715,692 | 8/1955 | Cardwell | 313/359 X |
| 2,754,442 | 7/1956 | Boutry et al. | 313/363 |
| 2,831,996 | 4/1958 | Martina | 315/111 |
| 3,264,511 | 8/1966 | Yamasaki | 313/209 |
| 3,546,513 | 12/1970 | Henning | 313/361 |
| 3,623,136 | 11/1971 | Tomita et al. | 313/209 |

OTHER PUBLICATIONS

"A Review of PIG Sources for Multiply Charged Heavy Ions," by J. R. J. Bennett, *IEEE Transactions on Nuclear Science*, Vol. NS–19, pp. 48–68, Apr. 1972.

*Primary Examiner*—Palmer C. Demeo
*Attorney, Agent, or Firm*—Geoffrey D. Green, David P. Kelley

[57] ABSTRACT

A cold-cathode ion source includes a specially shaped hollow anode and specially shaped anode-cathode insulators to preclude the buildup of short-circuiting bridges of sputtered cathode material. When used with solid feed material, the source can also include an oven-anode having cavities for vaporizing the solid feed material and passages connecting the cavities to the bore of the anode. The geometry of the oven-anode provides an increasing temperature gradient from the cavities to the bore that minimizes condensation of vaporized feed material that could block the ports.

7 Claims, 5 Drawing Figures

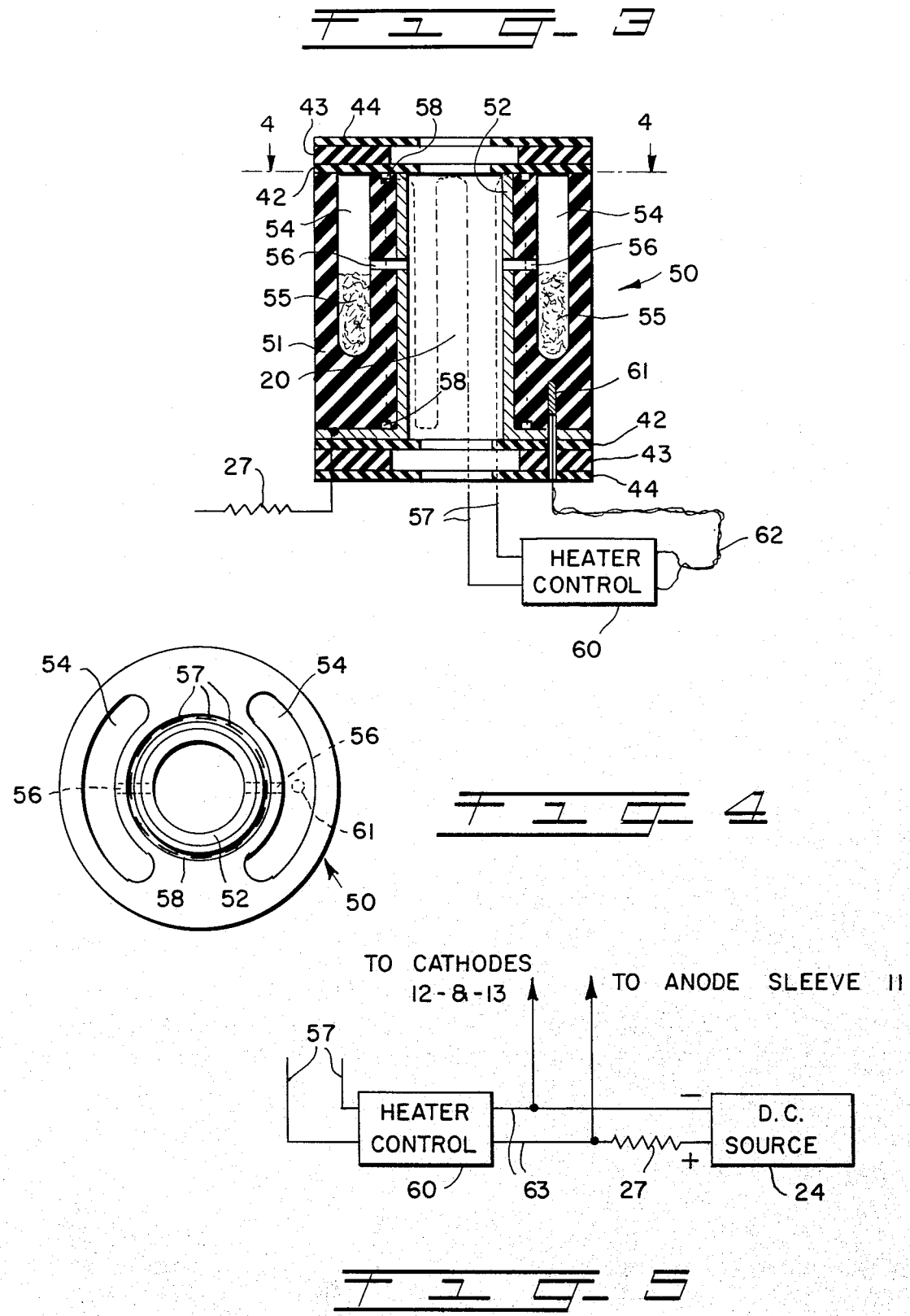

COLD-CATHODE ION SOURCE

BACKGROUND OF THE INVENTION

1. Field of the Invention

This invention relates to ion sources, particularly to an improved cold-cathode ion source for use in ion implantation systems.

2. Description of the Prior Art

With the advent of ion implantation processes for fabrication of semiconductor devices and related components, it has become desirable to improve presently known ion sources for inclusion in ion implantation systems suitable for use in manufacturing environments. One type of source that is useful for ion implantation is the Penning cold-cathode source, which typically comprises a hollow anode, a first cathode separated by an insulator from one end of the anode and having an extraction aperture therein, a second cathode separated by an insulator from the opposite end of the anode and having a gas entry port therein, and a magnet coil surrounding the anode. A plasma discharge maintained between the anode and the cathodes is contained by the magnetic field produced by the coil. The plasma discharge ionizes feed gas introduced through the entry port. External extraction electrodes form an ion beam from the resulting ions in the plasma discharge. Water cooling means are typically provided to remove heat generated by both the coil and the plasma discharge. A gaseous feed material, for example, boron trifluoride for boron ions or phosphine for phosphorus ions, is introduced through the gas entry port. Alternatively, an elemental solid feed material, for example, arsenic or antimony, is vaporized in an external oven connected by a passage to the gas entry port. It is also known to place an oven in the region of the plasma discharge. Typical prior art cold-cathode sources are described in an article by J. R. J. Bennett, "A Review of PIG Sources for Multiply Charged Heavy Ions," *IEEE Transactions on Nuclear Science*, Vol. NS-19, pp. 48–68, April 1972.

Ion implantation is a high-vacuum process, and servicing the ion source in an ion implantation system requires opening at least the source end of the system to atmosphere in order to gain access to the source, and then re-exhausting that part of the system. Such a procedure is time consuming and disruptive in a manufacturing environment, and it is clearly desirable to increase the time between such servicing episodes.

Two main lifetime-reducing difficulties are encountered with the cold-cathode source described above. First, material sputtered mainly from the cathodes by the plasma discharge builds up between the cathodes and the anode, causes short circuits, and changes the shape and stability of the plasma discharge. Second, when solid source material is used, vaporized solid feed material condenses at cooler points in the passage connecting the oven to the gas entry port, eventually blocking the passage. Other problems can result from the erosion of parts of the source by the sputtering effects of the plasma discharge, and the buildup of an insulating layer of condensed feed material on the anode. Such a buildup can increase the voltage required to strike an arc between the anode and cathodes, and, if heavy enough, can completely prevent striking the arc.

The magnitude of the beam current produced by an ion source is importantly related to the production rate of an ion implantation system containing the source; generally, the higher the beam current the less time needed to implant a given dose of ions in a batch of product. Unfortunately, operating an ion source at a higher beam current typically accelerates development of the lifetime-reducing difficulties noted above. Thus, it is doubly important to reduce the effects of those difficulties.

SUMMARY OF THE INVENTION

An extended-lifetime cold-cathode ion source according to the invention includes insulating discs between the cathodes and the anode, each insulating disc having an aperture therein with at least one annular groove in the wall of the aperture, and/or an anode having a region of increased bore diameter at each end; and, for use with solid feed materials, an oven-anode having cavities therein for vaporizing the solid feed material and passages connecting the cavities to the bore of the anode. The annular grooves in the insulating discs and the increased-diameter regions in the anode serve to contain sputtered cathode material and thereby discourage the development of short-circuiting bridges. The geometry of the combined anode-oven assures that vaporized feed material experiences an increasing temperature gradient along the connecting passages, minimizing condensation that would block the passages.

These and other aspects of the invention will become apparent from the drawings and the following description.

BRIEF DESCRIPTION OF THE DRAWINGS

FIG. 3 is a partial cross-sectional view of an alternate oven-anode for use with solid feed materials in the ion source of FIG. 1;

FIG. 4 is an end view of part of the oven-anode of FIG. 3; and

FIG. 5 is a block diagram showing an alternate method of controlling energy supplied to a heating element in the oven-anode shown in FIG. 4.

DETAILED DESCRIPTION

Figure 1:
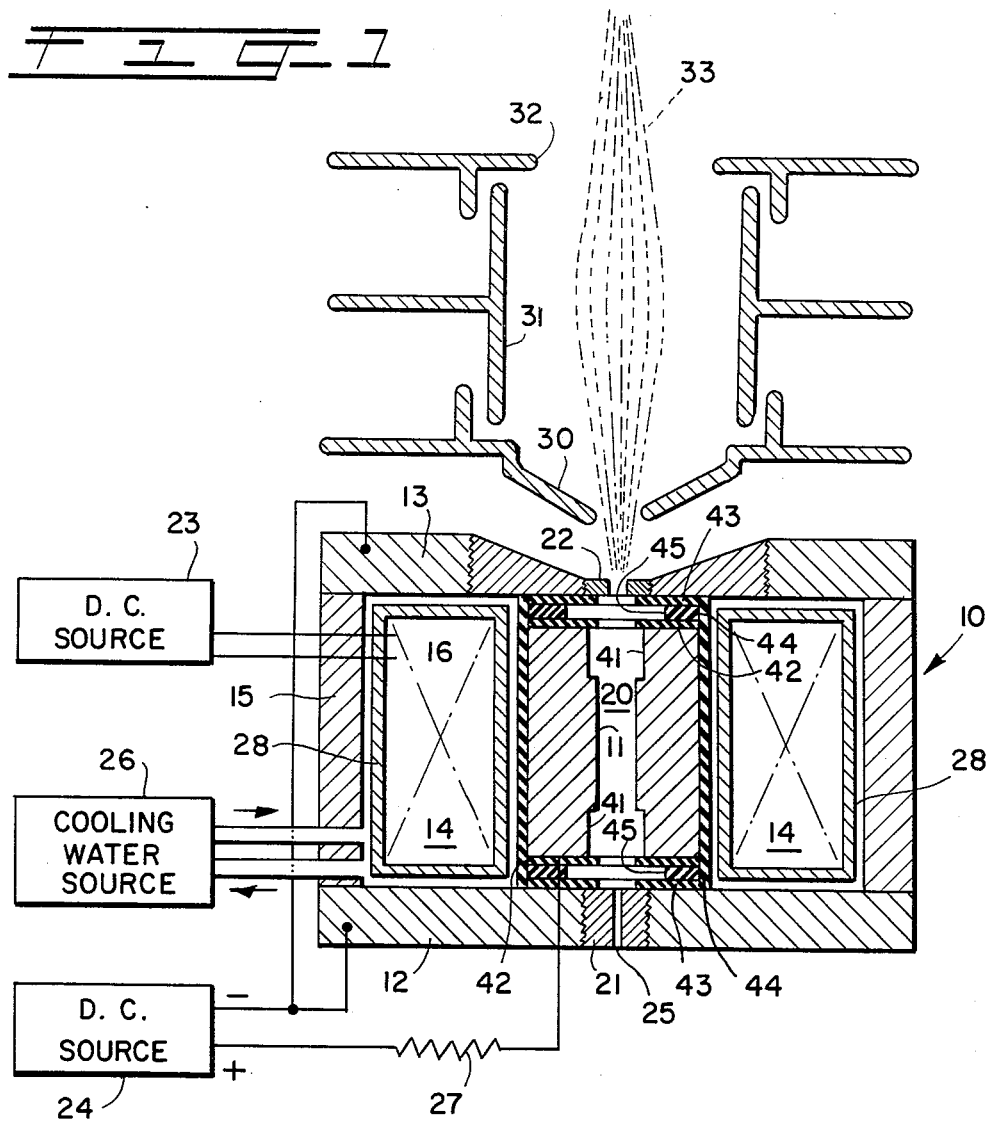
FIG. 1 is a partially diagrammatic cross-sectional view of an ion source according to the invention for use with gaseous feed materials.

FIG. 1 is a cross-sectional view of one embodiment of an improved Penning-type cold-cathode ion source according to the invention. Referring to FIG. 1, source 10 comprises anode 11, base cathode 12, extraction cathode 13, coil 14, magnetic collar 15, and anode insulator 16. Source 10 is cylindrical in outline, thus anode 11, coil 14, magnetic collar 15, and anode insulator 16 are essentially tube-shaped, and cathodes 12 and 13 are essentially disc-shaped. The general arrangement of these components is typical of Penning-type, cold-cathode ion sources known in the art.

In operation, chamber 20 is maintained at a pressure of about 1–100 μm. A plasma discharge is produced in chamber 20 between anode 11 and both of cathodes 12 and 13. The plasma discharge is contained by an axial magnetic field produced by coil 14. Cathode inserts 21 and 22 are typically made removable for easy replacement because these components are eroded or sputtered by the action of the plasma discharge. The plasma discharge ionizes source feed gas injected through gas entry port 25 from an external source (not shown).

Coil 14 is conventionally powered from D-C source 23. The plasma discharge is supplied from D-C source 24, having a positive terminal connected through ballast resistor 27 to anode 11, and a negative terminal connected to the outer conducting portions of source 10, namely cathodes 12 and 13. In an exemplary ion source constructed according to the invention, source 23 supplied about 1KW of power to coil 14, and source 24 established a potential of about 1000v between anode 11 and cathodes 12 and 13. Such D-C sources are well known in the art.

Coil 14 is enclosed in a metal housing 28, which is cooled by water from cooling water source 26 to remove heat generated within the coil itself, and, to some extent, heat generated by the plasma discharge in chamber 20. Anode insulator 16 provides electrical and thermal insulation between anode 11 and its surroundings. The temperature inside chamber 20 can be controlled by choosing the material of insulator 16 to have an appropriate thermal transfer coefficient. Other factors can affect this temperature, however, as will be noted below.

Typical materials for the elements of source 10 are soft iron or carbon for cathodes 12 and 13, soft iron for magnetic collar 15, aluminum for housing 28, carbon or stainless steel for anode 11, boron nitride for insulator 16, and carbon, tantalum, or iron for cathode inserts 21 and 22. The iron in cathodes 12 and 13 and magnetic collar 15 provides a return path for the magnetic field so that the power necessary to produce the field is not excessive. The shape of the cathodes contributes to the configuration of the field in chamber 20, and thus the shape of the plasma discharge.

Electrodes 30, 31, and 32 serve to extract an ion beam 33 from the plasma inside chamber 20. Various D-C potentials are connected to electrodes 30, 31, and 32 to produce the electric field necessary to extract and shape beam 33. However, a detailed understanding of the function of electrodes 30, 31, and 32 is not necessary to comprehend the present invention. A fuller discussion of their functioning is provided in my co-pending application Ser. No. 551,216, filed Feb. 19, 1975.

As noted above, the lifetime of an ion source is limited, and it is desirable to maximize the time between servicing episodes. One limiting factor in how long a cold-cathode ion source can be used relates to the buildup of conductive deposits between the anode and the cathode. Such deposits mainly comprise sputtered cathode material, and no way has been found to prevent such sputtering. Therefore, efforts have been concentrated on minimizing the effect of such deposits. Since the anode cannot be spaced too far from the cathodes without adversely affecting the shape and stability of the plasma discharge, it is necessary to make careful provision at the interfaces between the anode and the cathodes to minimize the effect of conductive deposits.

Figure 2:
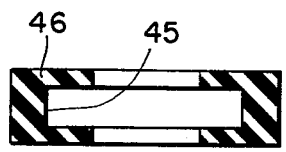
FIG. 2 is a cross-sectional view of an alternate insulating disc for use in the source of FIG. 1.

To this end, insulators preferably comprising groups of washer-shaped discs are placed between the anode and each cathode to separate the cathode and the anode, and the bore of the anode is increased in diameter at each end region 41. In each group of discs, two outer discs 42 and 43 are separated by an inner disc 44 having a larger interior diameter, thus forming an annular groove 45 between the outer discs. Inner disc 44 is preferably thicker than outer discs 42 and 43. Three separate discs are used for convenience of fabrication; however, as shown in FIG. 2, a single thicker disc 46 having a circumferential groove 45 in the wall of its aperture could be machined from insulating material. A typical material used for these discs is boron nitride. Since such discs also conduct heat away from the anode and the discharge region, the choice of material for the discs can also affect the temperature inside chamber 20.

In operation, sputtered cathode material collects in annular groove 45, thus reducing the rate at which deposits build up between associated cathode 12 or 13 and anode 11. Sputtered material also collects inside end regions 41. The increase in insulating path length between the anode and the cathodes resulting from increasing the diameter of regions 41 and the provision of the annular grooves 45 also serves to improve the stability of the plasma discharge. It will be clear that the provision of either regions 41 or grooves 45 will be effective in improving the operation of the source.

FIG. 3 is a partial cross-sectional diagram of an oven-anode for the source shown in FIG. 1, which can be used in place of anode 11 for solid feed materials such as antimony or arsenic. FIG. 4 is an end view of part of the oven-anode. Referring to FIGS. 3 and 4, oven-anode 50 comprises an essentially tubular oven 51, which can be machined from a single piece of suitable material, for example, boron nitride. Conductive anode sleeve 52 is mounted within the oven and is connected to power supply 24 (FIG. 1) via resistor 27 in a manner similar to the connection of anode 11 in FIG. 1. Oven 51 contains a number of cavities and passages. Cavities 54 fabricated in the walls of oven 51 hold the solid feed material 55. Cavities 54 can be arcuate, as shown, circular, or any other convenient shape. Passages 56 communicate with chamber 20 through the inner wall of oven 55 and anode sleeve 56. Insulating discs 42, 43, and 44, or alternate discs 46 as shown in FIG. 2, again are used between the oven-anode 50 and the cathodes (not shown) when the oven-anode is assembled in the source. The upper group of discs can also serve to close the open ends of the cavities 54. Alternatively, removable plugs (not shown) can be used to close the ends of the cavities.

An auxiliary electrical heating element in the form of heating wire 57 is embedded in axial holes in the walls of oven 51. The heating wire is wound back and forth through the holes and is passed from hole to hole at the ends of oven 51 in annular grooves 58. Current from heater control 60 energizes heating wire 57. Thermocouple 61 provides temperature information to control 60 via conductors 62 to maintain a desired temperature in cavities 54, in a manner well known in the art.

The back-and-forth winding of heating wire 57 tends to cancel any effect that current in the heating wire would have on the magnetic field produced by coil 14 when oven-anode 51 is used in ion source 10. A suitable material for heating wire 57 is nichrome.

In operation, the plasma discharge in chamber 20 provides much of the heat necessary to maintain cavities 54 at the proper temperature. This temperature essentially determines the number of ions available in chamber 20 for extraction into the ion beam. Heat is actually drawn away from oven 51 through insulator 16 and through insulating discs 42, 43 and 44 by the cooling apparatus for coil 14. The material of insulator 16 and discs 42, 43 and 44 can be chosen to have a thermal transfer coefficient so that the temperature of cavities 54 is about correct for the vaporization of feed material 55. However it is preferable to choose the material for these components so that heat from the plasma discharge maintains cavities 54 at a temperature slightly below that necessary to vaporize feed material 55, and to provide the additional increment of heat necessary to bring cavities 54 to the proper vaporization temperature with heating wire 57. More precise control of the temperature of cavities 54, and thus the number of ions in chamber 20, is possible in this way.

The temperature necessary in chamber 20 to bring cavities 54 to the proper temperature is also a function of the diameter of passages 56. The larger the diameter of the passages, the lower the temperature the chamber need be to maintain a given temperature in the cavities.

The resulting heat distribution in anode-oven 51 is such that the temperature decreases radially from chamber 20 to insulator 16. Vaporized feed material 55 experiences increasing temperatures as it passes from cavities 55 through passages 56 into chamber 20; and there are no cooler regions in passages 56 that would tend to condense vapor and block the passages.

If it is desired to operate the source with anode 52 at a much higher temperature than cavities 54, anode 52 can be separated from oven 51 by an insulating region. This could be accomplished simply by providing a void between the anode and the oven.

To illustrate further the operation of oven-anode 50, an example of an oven-anode for use with arsenic feed material will now be described. An oven 51 was machined from boron nitride with a length of about 1.5 inches, an outer diameter of about 1.25 inches, and an inner diameter of about 0.5 inch. Four circular cavities 54 were formed in the walls of the oven. Passages 56 were 0.06 inch in diameter. Anode sleeve 52 was machined from ceramic to fit inside oven 51, and with an inner diameter of 1.25 inches. Insulator 16 was machined from ceramic with a thickness of about 0.1 inch. In operation, the plasma discharge tended to raise the temperature of oven 51, as measured by thermocouple 61, to about 250°C. The addition of heat from heating element 57 raised and maintained temperature measured by thermocouple 61 to about 330°C, sufficient to properly vaporize the arsenic feed material. A beam current of about 5ma has have been produced for about 24 hrs. by this source. In an ion implantation machine, such a beam can be directed through analyzing and accelerating means well known in the art to produce a target current of about 2ma.

It has been found that the magnitude of the voltage needed to maintain the arc between anode sleeve 53 and cathodes 12 and 13 is directly related to the concentration of ions available in chamber 20 for extraction into the ion beam. Since the ultimate object is to control this concentration, it is more direct to control the increment of heat added by heating wire 57 according to the arc voltage than according to the temperature of cavity 54. FIG. 5 shows an alternate embodiment in which the leads connecting source 24 to anode 11 and cathodes 12 and 13 are also connected via leads 63 to the input of heater control 60. Heater control 60 is then adapted to accept the relatively high arc voltage, and to decrease the amount of energy supplied to heating wire 57 when the arc voltage increases. Thus, control 60 maintains the arc voltage substantially constant to indirectly control the ion concentration in chamber 20.

Note that anode sleeve 52 in FIG. 3 is shown without the increased-internal-diameter regions shown in FIG. 1 for anode 11 at 41. These increased-internal-diameter regions can be provided if anode sleeve 52 is thick enough; however, the space necessary for oven 51 may preclude this. Provision of such regions would tend to prolong the lifetime of the source, as explained above.

The anodes described so far, i.e., anode 11 in FIG. 1 and anode sleeve 52 in FIG. 3, have been described as defining a cylindrical discharge chamber 20. However, in some applications, it may be desirable to have some other cross-sectional shape for chamber 20, e.g., square or rectangular. A circular chamber 20 would typically be used for generating an ion beam having a circular cross-section, but a rectangular chamber 20 would be desirable for generating an ion beam having a rectangular cross section. It will be apparent that ion sources having other interior cross sections for chamber 20 could be constructed.

One skilled in the art may make changes and modifications to the exemplary embodiments of the invention disclosed herein, and may devise other embodiments, without departing from the spirit and scope of the invention.

What is claimed is:

1. An improved cold-cathode ion source comprising: a hollow anode, at least one substantially planar cathode separated from one end of the anode by insulating means and having an aperture therein substantially coaxial with the bore of the anode, and means for creating an axial magnetic field in the bore of the anode, wherein the improvement comprises:
    the insulating means comprises a body of insulating material having an aperture therein substantially coaxial with the bore of the anode and at least one circumferential groove in the wall of the aperture to inhibit the formation of conducting bridges of sputtered material between the anode and the cathode.

2. The improved cold-cathode ion source of claim 1 in which the body of insulating material further comprises at least one group of discs having apertures therein substantially coaxial with the bore of the anode, each group having two outer discs separated by an inner disc having a larger aperture than the outer discs.

3. A cold-cathode ion source for providing ions from solid feed material having at least one cathode and an oven-anode, the oven-anode comprising:
    a hollow anode sleeve, and
    an oven body surrounding at least part of the anode sleeve having therein at least one cavity for accommodating the solid feed material;
    the anode sleeve and the oven body having a passage therein connecting the cavity to the hollow portion of the anode sleeve for conveying vaporized solid feed material to the hollow portion; and
    the anode sleeve and the cathode being connectable to means for producing an arc between the anode and the cathode to generate a plasma discharge in the hollow portion, the solid feed material being vaporized by heat from the plasma discharge.

4. The ion source of claim 3 wherein the oven-anode is surrounded by a cooling means and which further comprises:
    means separating the oven-anode and the cooling means for transferring heat from the oven-anode to the cooling means.

5. The ion source of claim 4, wherein the heat transferring means and the cooling means maintain the temperature of the cavity below the vaporization temperature of the solid feed material when heated only by the plasma discharge, which further comprises:
auxiliary heating means for raising the temperature of the cavity to substantially the vaporization temperature of the solid feed material.
6. The ion source of claim 5 which further comprises: means for controlling the auxiliary heating means to maintain the temperature of the cavity substantially constant.
7. The ion source of claim 5 which further comprises: means for controlling the auxiliary heating means to maintain the magnitude of the arc voltage between the anode and the cathode substantially constant.

* * * * *